(12) United States Patent
Li et al.

(10) Patent No.: US 11,927,608 B1
(45) Date of Patent: Mar. 12, 2024

(54) AC/DC CLOSED-LOOP CURRENT SENSOR

(71) Applicant: DIGITAL GRID RES. INST., CHINA SOUTHERN PWR. GRID, Guangzhou (CN)

(72) Inventors: Peng Li, Guangzhou (CN); Qiancheng Lv, Guangzhou (CN); Bing Tian, Guangzhou (CN); Xiaopeng Fan, Guangzhou (CN); Zhong Liu, Guangzhou (CN); Zhiming Wang, Guangzhou (CN); Renze Chen, Guangzhou (CN); Jie Wei, Guangzhou (CN); Xu Yin, Guangzhou (CN); Zejie Tan, Guangzhou (CN); Zhenheng Xu, Guangzhou (CN); Senjing Yao, Guangzhou (CN); Licheng Li, Guangzhou (CN); Yuehuan Lin, Guangzhou (CN); Shengrong Liu, Guangzhou (CN); Bofeng Luo, Guangzhou (CN); Jiaming Zhang, Guangzhou (CN)

(73) Assignee: DIGITAL GRID RES. INST., CHINA SOUTHERN PWR. GRID, Guangzhou (CN)

( * ) Notice: Subject to any disclaimer, the term of this patent is extended or adjusted under 35 U.S.C. 154(b) by 0 days.

(21) Appl. No.: 18/369,353

(22) Filed: Sep. 18, 2023

(30) Foreign Application Priority Data

Oct. 26, 2022 (CN) .......................... 202211330609.6

(51) Int. Cl.
 *G01R 19/00* (2006.01)
 *G01R 15/20* (2006.01)
(52) U.S. Cl.
 CPC ....... *G01R 19/0092* (2013.01); *G01R 15/205* (2013.01)

(58) Field of Classification Search
 CPC .......................... G01R 19/0092; G01R 15/205
 See application file for complete search history.

(56) References Cited

U.S. PATENT DOCUMENTS

2001/0050552 A1* 12/2001 Sandquist ............ G01R 15/205
 324/117 R
2020/0264245 A1* 8/2020 Erhart .................... G01R 33/02

FOREIGN PATENT DOCUMENTS

| CN | 201017011 Y | 2/2008 |
| CN | 204679548 U | 9/2015 |

(Continued)

OTHER PUBLICATIONS

Chinese Office Action for corresponding Application No. 202211330609.6 dated Dec. 21, 2022, 18 pages.

(Continued)

*Primary Examiner* — Dominic E Hawkins
(74) *Attorney, Agent, or Firm* — Seyfarth Shaw LLP

(57) ABSTRACT

The present disclosure relates to an AC/DC closed-loop current sensor, including a magnetism gathering iron core, a TMR chip, a signal processing circuit, a signal generator, and a feedback coil. The TMR chip is arranged at an air gap of the magnetism gathering iron core and connected to the signal processing circuit. The signal processing circuit is connected to the signal generator. The feedback coil is wound around the magnetism gathering iron core and connected to the signal generator. The signal processing circuit is configured to select from the induced signal of the TMR chip and make an amplification to obtain a current signal component and send the current signal component to the signal generator. The signal generator is configured to adjust a current output to the feedback coil based on the current signal component, and output a measurement result of the selected current signal component.

10 Claims, 4 Drawing Sheets

(56) References Cited

FOREIGN PATENT DOCUMENTS

| | | |
|---|---|---|
| CN | 106443125 A | 2/2017 |
| CN | 207096292 U | 3/2018 |
| CN | 110007133 A | 7/2019 |
| CN | 112881771 A | 6/2021 |
| CN | 114487560 A | 5/2022 |
| JP | H07319566 A | 12/1995 |

OTHER PUBLICATIONS

Chinese Office Action for corresponding Application No. 202211330609.6 dated Jan. 11, 2023, 19 pages.

Xu Aidong, et al., "Research and Application of Micro Current Sensor Based on Giant Magnetoresistance Effect," dated Jul. 22, 2019, 8 pages.

* cited by examiner

AC/DC CLOSED-LOOP CURRENT SENSOR

CROSS-REFERENCE TO RELATED APPLICATIONS

The present application claims priority to Chinese patent application No. 2022113306096, filed on Oct. 26, 2022, the entire content of which is incorporated herein by reference.

TECHNICAL FIELD

The present disclosure relates to the technical field of power measurement, and in particular, to an AC/DC closed-loop current sensor.

BACKGROUND

With the widespread application of power systems, the demand for power measurement is also increasing. With the increasing maturity of microelectromechanical fabrication technologies, magnetic field sensing chips based on microelectromechanical technologies provide a technical foundation for non-invasive current measurement. At present, non-contact current measurement technologies mainly indirectly restore measured current information by measuring magnetic field generated by a measured current. Among numerous magnetic field sensing chips, tunneling magnetoresistance (TMR) chips are widely used because of their high sensitivity and wide linear range. For a very wide current operating range of power systems, TMR current sensors based on closed-loop feedback have emerged.

SUMMARY

An AC/DC closed-loop current sensor is provided, including a magnetism gathering iron core, a TMR chip, a sampling circuit, a bandpass filtering circuit, a DC filtering circuit, a selection circuit, a signal amplification circuit, a signal generator, and a feedback coil. The TMR chip is arranged at an air gap of the magnetism gathering iron core. The sampling circuit is connected to the TMR chip, the bandpass filtering circuit, and the DC filtering circuit respectively. The selection circuit is connected to the bandpass filtering circuit, the DC filtering circuit, and the signal amplification circuit respectively. The signal amplification circuit is connected to the signal generator. The feedback coil is wound around the magnetism gathering iron core and connected to the signal generator. The magnetism gathering iron core is configured to converge an induced magnetic field based on a measured current. The TMR chip is configured to output an induced signal based on the induced magnetic field. The sampling circuit is configured to sample and process the induced signal. The bandpass filtering circuit and the DC filtering circuit are configured to select a current signal component from the induced signal. The selection circuit is configured to select the current signal component. The signal amplification circuit is configured to amplify the current signal component to obtain the current signal component and send the current signal component to the signal generator. The signal generator is configured to adjust a current output to the feedback coil based on the current signal component, and output a measurement result of the selected current signal component. The bandpass filtering circuit is a dual-phase lock-in amplification circuit, the dual-phase lock-in amplification circuit adopts a lock-in amplifier with dual-phase phase-sensitive detection technology, a parallel lock-in amplifier is set on the lock-in amplifier, and a 90° phase shift is added to the parallel lock-in amplifier. The dual-phase lock-in amplification circuit uses a cross-correlation characteristic of a reference signal and a sample signal to extract a sample signal component with the same frequency and phase as the reference signal.

In some embodiments, the sampling circuit is configured to obtain the induced signal of the TMR chip and output a sample signal, the bandpass filtering circuit is configured to select an AC signal component of the sample signal based on a set reference signal frequency, the DC filtering circuit is configured to filter a DC signal component of the sample signal, and the selection circuit is configured to connect the bandpass filtering circuit and/or the DC filtering circuit.

In some embodiments, the set reference signal frequency for the dual-phase lock-in amplification circuit is 50 Hz.

In some embodiments, the DC filtering circuit is a second-order RC low-pass DC filtering circuit.

In some embodiments, the DC filtering circuit is an active second-order low-pass filtering circuit.

In some embodiments, the signal amplification circuit includes an addition circuit and an integral amplification circuit. The addition circuit is connected to the signal selection circuit and the integral amplification circuit respectively, and the integral amplification circuit is connected to the signal generator. The addition circuit is configured to superimpose the current signal component output from the signal selection circuit, and the integral amplification circuit is configured to amplify a superimposed signal and transmit the superimposed signal to the signal generator.

In some embodiments, the signal generator is configured to output a feedback current to the feedback coil and adjust an amplitude of the feedback current based on the current signal component until the induced signal output from the TMR chip is 0, and output the measurement result of the selected current signal component. The feedback current is used for the feedback coil to generate a magnetic field opposite to the measured current.

In some embodiments, the signal generator is further configured to adjust direction of the feedback current based on the current signal component.

In some embodiments, the magnetism gathering iron core is an open circular structure with an air gap.

In some embodiments, the TMR chip is a single-axis TMR chip.

One or more embodiments of the present disclosure will be described in detail below with reference to drawings. Other features, objects and advantages of the present disclosure will become more apparent from the description, drawings, and claims.

DETAILED DESCRIPTION OF THE EMBODIMENTS

In order to make the purpose, technical solutions and advantages of the present disclosure more clearly understood, the disclosure will be further described in detail with the accompanying drawings and embodiments. It should be understood that the specific embodiments described here are only used to explain the disclosure and not to limit the disclosure.

Unless otherwise defined, all technical and scientific terms used herein have the same meaning as commonly understood by those skilled in the technical field to which the present disclosure belongs. The terms used herein in the specification of the disclosure are for the purpose of describing specific embodiments only, and are not intended to limit the disclosure.

It will be understood that "connected" in the following embodiments should be understood as "electrically connected", "connected by communication", etc. if there are transmissions of electrical signals or data between the circuits, modules, units, etc. to be connected to each other.

As used herein, the singular forms "a", "an" and "the" may also include the plural forms, unless the context clearly indicates otherwise. It should also be understood that the terms "includes/comprises" or "has" etc. designate the presence of stated features, integers, steps, operations, components, parts or combinations thereof, but do not preclude the possibility of the presence or addition of one or more other features, integers, steps, operations, components, parts or combinations thereof.

Closed-loop current sensors known by the applicant are designed with complex feedback circuits to ensure that a measured magnetic field at the TMR is constant at zero when a TMR output signal is amplified and fed back to a measurement loop. However, signals measured by the closed-loop current sensors known by the applicant are chaotic, and the closed-loop current sensors known by the applicant are unable to accurately measure a current component signal that need to be detected.

Embodiments of the present disclosure provide an AC/DC (Alternating Current/Direct Current) closed-loop current sensor that can be applied in an application environment for measuring certain current signal components. A magnetism gathering iron core of the AC/DC closed-loop current sensor is an annular magnetism gathering iron core. A TMR chip is arranged at an air gap of the magnetism gathering iron core. A conductor to be measured is placed in the hollow of the magnetism gathering iron core and passes through the magnetism gathering iron core for measurement, and the TMR chip may sense a magnetic field and output an induced signal. Then, by selecting different circuits in signal processing circuits to perform closed-loop feedback on different current signal components, a measurement result is obtained.

Figure 1:
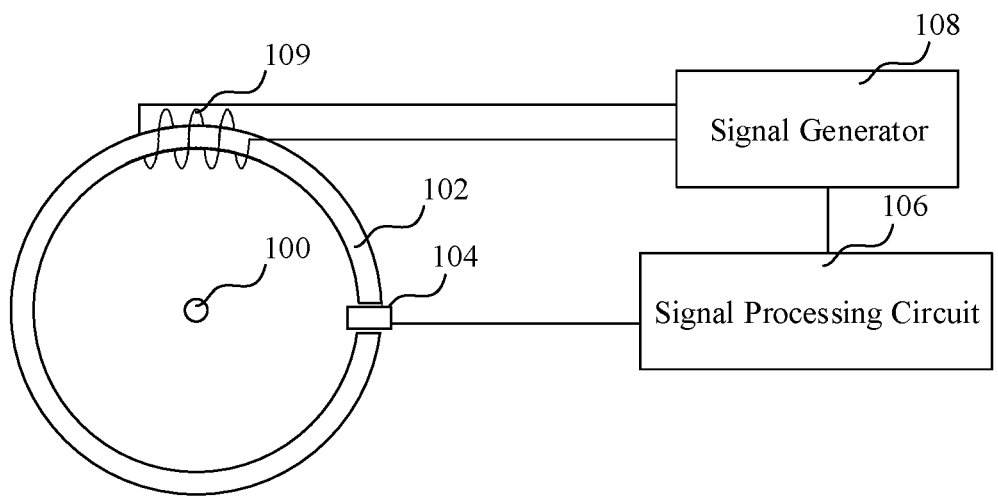
FIG. 1 is a schematic diagram showing a configuration of an AC/DC closed-loop current sensor in some embodiments.

In some embodiments, an AC/DC closed-loop current sensor is provided as shown in FIG. 1. The AC/DC closed-loop current sensor includes a magnetism gathering iron core 102, a TMR chip 104, a signal processing circuit 106, a signal generator 108, and a feedback coil 109. The TMR chip 104 is arranged at an air gap of the magnetism gathering iron core 102 and connected to the signal processing circuit 106. The signal processing circuit 106 is connected to the signal generator 108. The feedback coil 109 is wound around the magnetism gathering iron core 102 and connected to the signal generator 108. The magnetism gathering iron core 102 is configured to converge an induced magnetic field based on a measured current. The TMR chip 104 is configured to output an induced signal based on the induced magnetic field. The signal processing circuit 106 is configured to select from the induced signal of the TMR chip 104 and make an amplification to obtain a current signal component and send the current signal component to the signal generator 108. The signal generator 108 is configured to adjust a current output to the feedback coil 109 based on the current signal component, and output a measurement result of the selected current signal component.

The magnetism gathering iron core 102 is a kind of magnetism gathering iron material, and the magnetism gathering iron core 102 in the AC/DC closed-loop current sensor is annular and provided with the air gap. The TMR chip 104 is a magnetically sensitive element using a tunneling magnetoresistance effect. The TMR chip 104 has a high linearity within a certain range of the magnetic field, and the linearity increases as the TMR chip 104 gets closer to a zero point of the magnetic field. The TMR chip 104 of the closed-loop current sensor usually works at the zero point of the magnetic field to obtain a best linearity. The signal generator 108, also known as a signal source or oscillator, is capable of adjusting a corresponding output current based on a received signal.

Specifically, the TMR chip 104 is arranged at the air gap of the magnetism gathering iron core 102. During the measurement, a conductor 100 passes through the magnetism gathering iron core 102, and the current in the conductor 100 changes the induced magnetic field in the magnetism gathering iron core 102, and then a resistance of the TMR chip 104 may be changed accordingly, thus changing the induced signal of the TMR chip 104. The signal processing circuit 106 can select from the induced signal and make an amplification. When the induced signal of the TMR chip 104 is processed by the signal processing circuit 106, the signal processing circuit 106 selects a current signal component to be measured and filters out an interference of a current signal that do not need to be measured, and then amplifies the current signal component to be measured and sends the amplified current signal component to the signal generator 108. The signal generator 108 generates a corresponding current based on the received signal and outputs this current to the feedback coil 109 wound around the magnetism gathering iron core 102, and the current is also used to output the final measurement result.

Further, the magnetism gathering iron core 102 is annular and can be specifically designed as an open circular structure with an air gap. The TMR chip 104 is arranged at the air gap of the magnetism gathering iron core 102, and the conductor 100 passes through an annular body of the magnetism gathering iron core 102 and the specific position of the conductor 100 is not limited. A winding position of the feedback coil 109 on the magnetism gathering iron core 102 is not limited, and the feedback coil 109 may be wound around a part of the magnetism gathering iron core 102. The TMR chip 104 may be selected as a single-axis TMR chip.

In these embodiments, the signal processing circuit 106 selects the current signal component to be measured from the induced signal of the TMR chip 104, thus the interference from other current signal component is eliminated, and an accurate measurement of the specified current signal component can be achieved.

Figure 2:
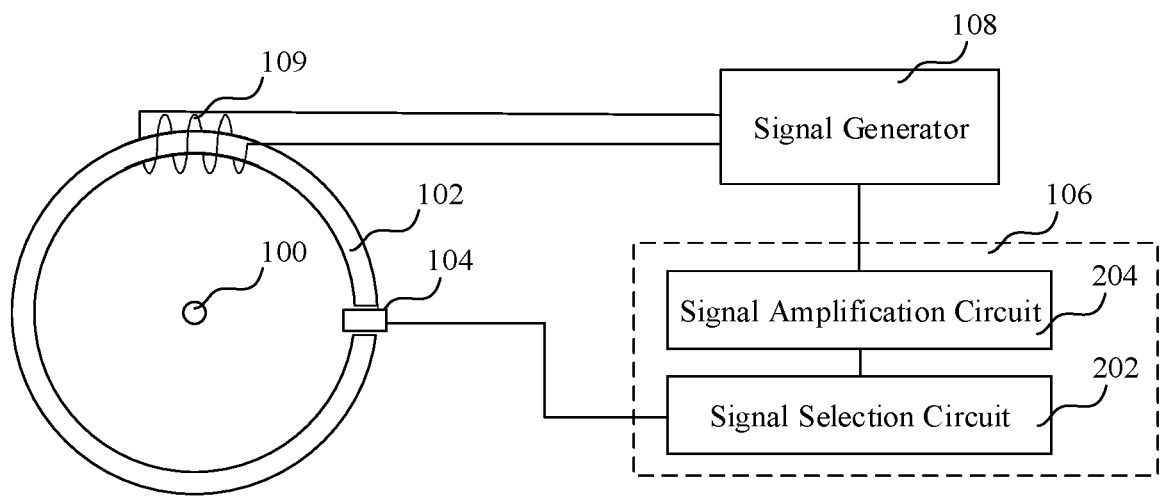
FIG. 2 is a schematic diagram showing a configuration of a signal processing circuit of an AC/DC closed-loop current sensor in some embodiments.

In some embodiments, as shown in FIG. 2, the signal processing circuit 106 includes a signal selection circuit 202 and a signal amplification circuit 204. The signal selection circuit 202 is connected to the TMR chip 104 and the signal amplification circuit 204 respectively. The signal amplification circuit 204 is connected to the signal generator 108. The signal selection circuit 202 is configured to select the current signal component, and the signal amplification circuit 204 is configured to amplify the current signal component.

Specifically, the signal processing circuit 106 is required to select from the induced signal and make an amplification. The signal selection circuit 202 receives the induced signal from the TMR chip 104 and selects the current signal component of the induced signal to extract the current signal component to be measured. The current signal component to be measured is then amplified by the signal amplification circuit 204 and output to the signal generator 108 which generates the corresponding current.

Figure 3:
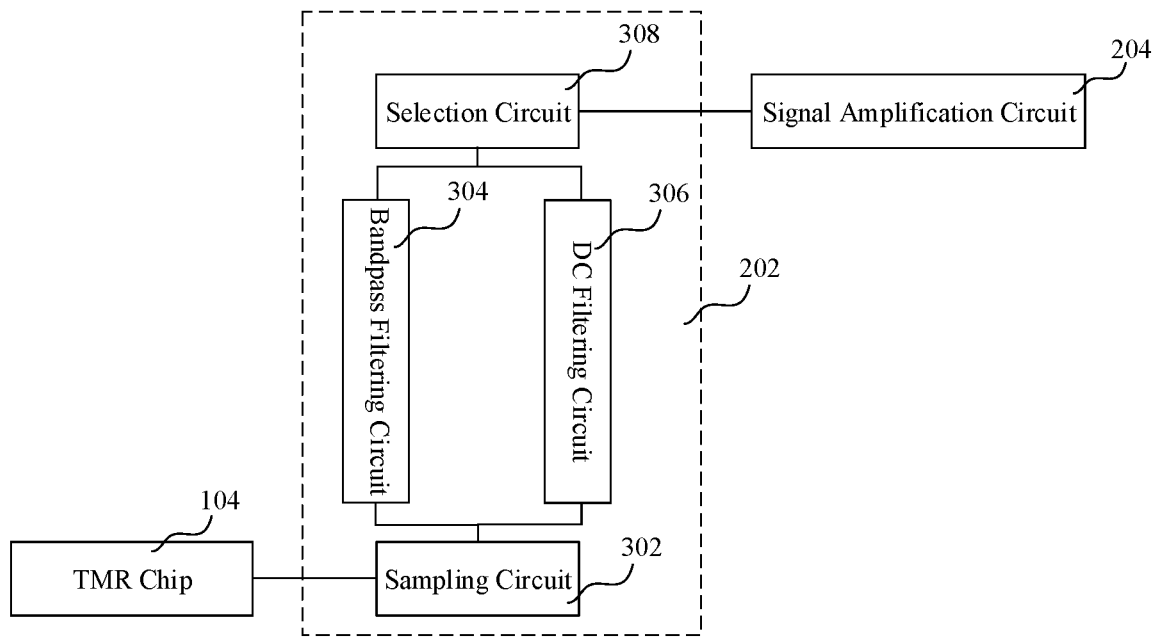
FIG. 3 is a block diagram showing a configuration of a signal selection circuit in some embodiments.

The circuits that select the current signal component to be measured from the induced signal are not the same. In some embodiments, as shown in FIG. 3, the signal selection circuit 202 includes a sampling circuit 302, a bandpass filtering circuit 304, a DC filtering circuit 306, and a selection circuit 308. The sampling circuit 302 is connected to the TMR chip 104, the bandpass filtering circuit 304, and the DC filtering circuit 306 respectively. The selection circuit 308 is connected to the bandpass filtering circuit 304, the DC filtering circuit 306, and the signal amplification circuit 204 respectively.

The bandpass filtering circuit 304 is a circuit that selects a specific frequency interval for AC, which allows only signals in a specific frequency band to pass while blocking signals of other frequency bands, similar to a bandpass filter. The DC filtering circuit 306 is a circuit capable of filtering out interference of an AC signal and retaining a DC signal.

Specifically, the sampling circuit 302 samples the induced signal in the TMR chip 104, and the induced signal is sampled and then passed through the bandpass filtering circuit 304 or through the DC filtering circuit 306, for the selection of the current signal component. The selection circuit 308 can select either or both of the bandpass filtering circuit 304 or the DC filtering circuit 306 to be used. After the selected circuit completes an extraction of the current signal component to be measured, the current signal component to be measured is output to the signal amplification circuit 204 by the selection circuit 308.

In these embodiments, by setting up signal processing circuits applied to different measurement environments, a DC signal component and an AC signal component can be selected for measurement, and an accurate measurement of the selected current component can be achieved. Moreover, an interference current is removed without going through a process of generating a feedback current, thus a power consumption of the system can be reduced.

In some embodiments, the sampling circuit 302 is configured to obtain the induced signal of the TMR chip 104 and output a sample signal, the bandpass filtering circuit 304 is configured to select an AC signal component of the sample signal based on a set reference signal frequency, the DC filtering circuit 306 is configured to retain a DC signal component of the sample signal, and the selection circuit 308 is configured to connect the bandpass filtering circuit 304 and/or the DC filtering circuit 306.

Specifically, the sampling circuit 302 samples the induced signal output from the TMR chip 104 to obtain the sample signal. The sample signal needs to pass through the bandpass filtering circuit 304 or the DC filtering circuit 306 so that a corresponding current signal component is extracted. The operator controls the connection and disconnection of the bandpass filtering circuit 304 and the DC filtering circuit 306 by the selection circuit 308 according to an actual required measurement. The bandpass filtering circuit 304 has the set reference signal frequency and is configured to select the AC signal component with the set reference signal frequency. The DC filtering circuit 306 is configured to select the DC signal component of the sample signal.

Further, the operator selects the bandpass filtering circuit 304 and/or the DC filtering circuit 306 according to an actual required measurement. For example, when a current to be measured is a direct current, the operator controls the selection circuit 308 to be connected to the DC filtering circuit 306 and disconnected from the bandpass filtering circuit 304. When the current to be measured is an alternating current with a reference frequency, the operator controls the selection circuit 308 to be connected to the bandpass filtering circuit 304 and disconnected from the DC filtering circuit 306. When the current to be measured includes both the direct current and the alternating current with the reference frequency, the operator controls the selection circuit 308 is simultaneously connected to the DC filtering circuit 306 and the bandpass filtering circuit 304.

In these embodiments, by setting bandpass filtering circuit 304 and the DC filtering circuit 306, the selection of current signal components for different measurement needs is realized. By setting the selection circuit 308 to control the connection and disconnection of the bandpass filtering circuit 304 and the DC filtering circuit 306, the AC/DC current sensor can be conveniently applied to DC measurement scenarios, AC measurement scenarios and hybrid measurement scenarios, greatly improving the convenience of measurement for different usage environments.

Figure 4:
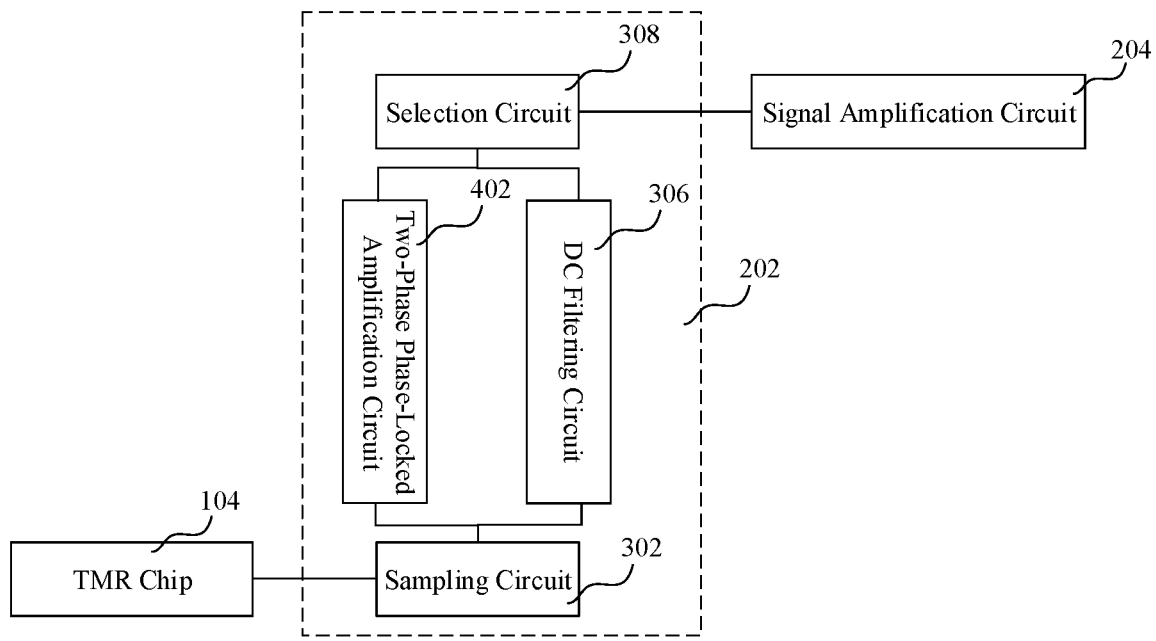
FIG. 4 is a block diagram showing a configuration of a signal selection circuit in another embodiments.

In some embodiments, as shown in FIG. 4, the bandpass filtering circuit 304 includes a dual-phase lock-in amplification circuit 402.

Figure 5:
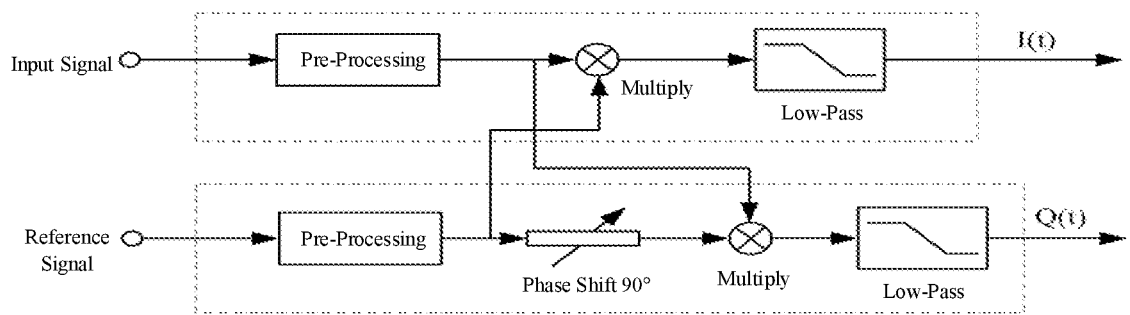
FIG. 5 is a schematic diagram showing a configuration of a dual-phase lock-in amplification circuit in some embodiments.

The dual-phase lock-in amplification circuit is shown in FIG. 5. The dual-phase lock-in amplification circuit adopts a lock-in amplifier with dual-phase phase-sensitive detection technology. A parallel lock-in amplifier is set on the lock-in amplifier, and a 90° phase shift is added to the parallel lock-in amplifier. The two lock-in amplifiers together form the dual-phase lock-in amplification circuit. The dual-phase lock-in amplification circuit uses a cross-correlation characteristic of a reference signal and the sample signal to extract a sample signal component with the same frequency and phase as the reference signal.

Specifically, an input signal is the sample signal output from the sampling circuit 302, and assuming that an input sample signal is denoted as:

$$S_I(t)=A \sin(\omega t+\alpha)+B(t),$$

where $S_I(t)$ is the input sample signal, A is an amplitude of the input signal, $\omega$ is a frequency of the input signal, $\alpha$ is a phase of the input signal, and $B(t)$ is the total noise.

Assuming that the reference signal is denoted as:

$$S_o(t)=C \sin(\omega_r t+c),$$

where $S_o(t)$ is the reference signal, C is an amplitude of the reference signal, $\omega_r$ is a frequency of the reference signal, c is a phase of the reference signal.

If $\omega_r=\omega$, then the sample signal and reference signal are pre-processed and output by the dual-phase lock-in amplification circuit, and the following equation can be obtained:

$$I(t)=0.5AC \cos(\alpha-c)$$

$$Q(t)=0.5AC \sin(\alpha-c),$$

where I(t) is an output signal of a first channel of the dual-phase lock-in amplification circuit, and Q(t) is an output signal of a second channel of the dual-phase lock-in amplification circuit.

The AC signal component to be solved can be obtained by integrating the output signal of the first channel and the output signal of the second channel of the dual-phase lock-in amplification circuit.

An amplitude of the AC signal component is denoted as:

$$A = 2\sqrt{I^2(t) + Q^2(t)}/C.$$

A phase angle of the AC signal component is denoted as:

$$\alpha = c + \tan^{-1}(Q/I).$$

In some embodiments, the set reference signal frequency for the dual-phase lock-in amplification circuit is 50 Hz.

Specifically, the dual-phase lock-in amplification circuit is essentially a bandpass filter with a high value of Q (i.e. a narrow bandwidth), and a reference frequency of the dual-phase lock-in amplification circuit is a frequency of the signal to be demodulated. The dual-phase lock-in amplification circuit can extract an amplitude and a phase angle of a specific frequency signal. In a power system, current sensors mainly measure an operating frequency current and a direct current, and an operating frequency signal to be measured is the AC signal with a frequency of 50 Hz. For this measurement scenario, the reference signal frequency of the dual-phase lock-in amplification circuit can be selected as 50 Hz.

In these embodiments, the AC/DC current sensor applied in the power system generally only needs to measure the DC signal and the AC signal with an operating frequency of 50 Hz. Therefore, the reference signal frequency of the dual-phase lock-in amplification circuit is set to 50 Hz, which is more applicable to power system scenarios.

Figure 6:
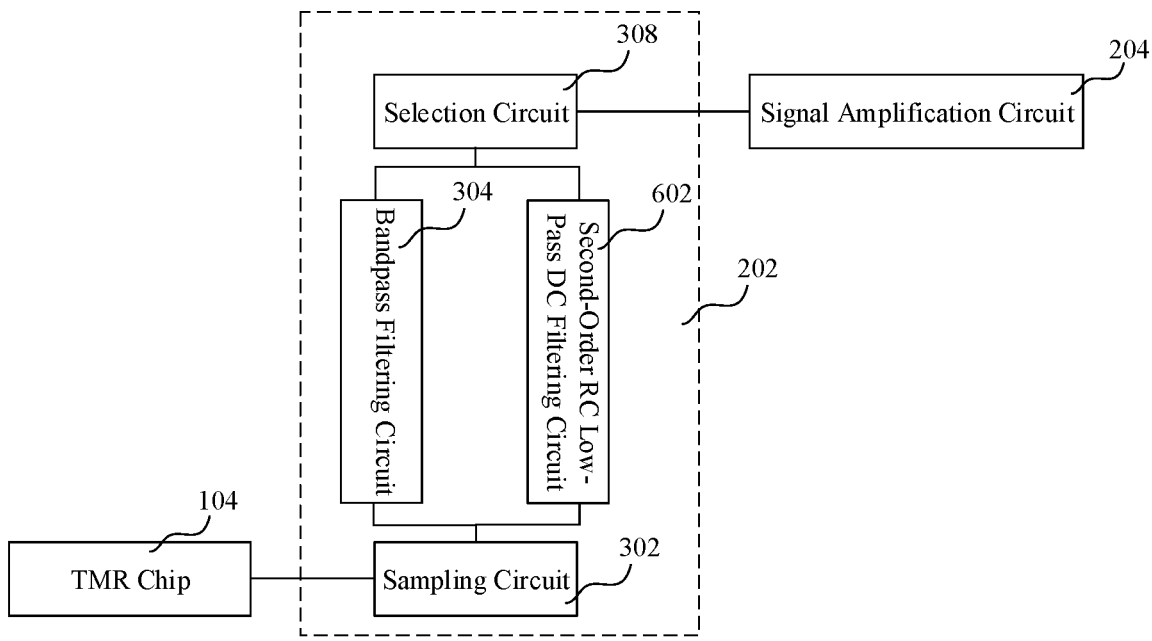
FIG. 6 is a block diagram showing a configuration of a signal selection circuit in further embodiments.

In some embodiments, as shown in FIG. 6, the DC filtering circuit 306 includes a second-order RC low-pass DC filtering circuit 602.

Figure 7:
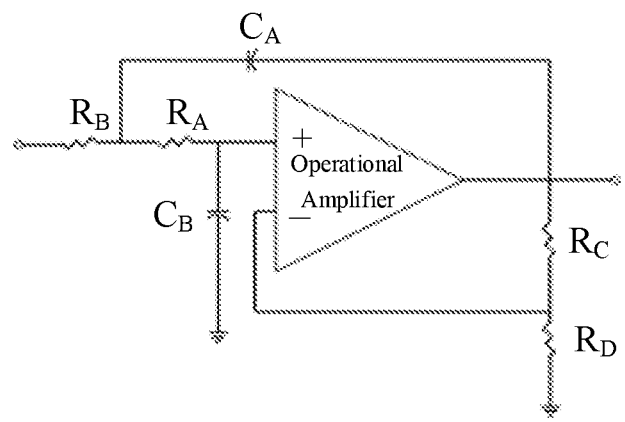
FIG. 7 shows a circuit for a second-order RC low-pass DC filtering in some embodiments.

The second-order RC low-pass DC filtering circuit 602 is shown in FIG. 7. An end of a first resistor $R_A$ is connected to the sampling circuit 302 through a second resistor $R_B$ and connected to an output terminal of an operational amplifier through a first capacitor $C_A$. Another end of the first resistor $R_A$ is connected to a positive input terminal of the operational amplifier and grounded through a second capacitor $C_B$. A third resistor $R_C$ and a fourth resistor $R_D$ are connected in series and a common terminal is connected to a negative input terminal of the operational amplifier. The other end of the third resistor $R_C$ is connected to an output terminal of the operational amplifier and the other end of the fourth resistor $R_D$ is grounded. The output terminal of the operational amplifier is connected to the selection circuit 308, and the output terminal is configured to send a filtered current signal component to the selection circuit 308.

Specifically, the DC filtering circuit 306 is configured to select the DC signal component of the sample signal, and the interference of the AC in the sample signal needs to be removed. In the circuit of FIG. 7, a cutoff frequency of the second-order RC low-pass DC filtering circuit is denoted as:

$$f_H = \frac{1}{2\pi\sqrt{R_A R_B C_A C_B}}.$$

A gain of the second-order RC low-pass DC filtering circuit depends on a voltage gain of the operational amplifier.

Further, the second-order RC low-pass DC filtering circuit may also be replaced with an active second-order low-pass filtering circuit.

Figure 8:
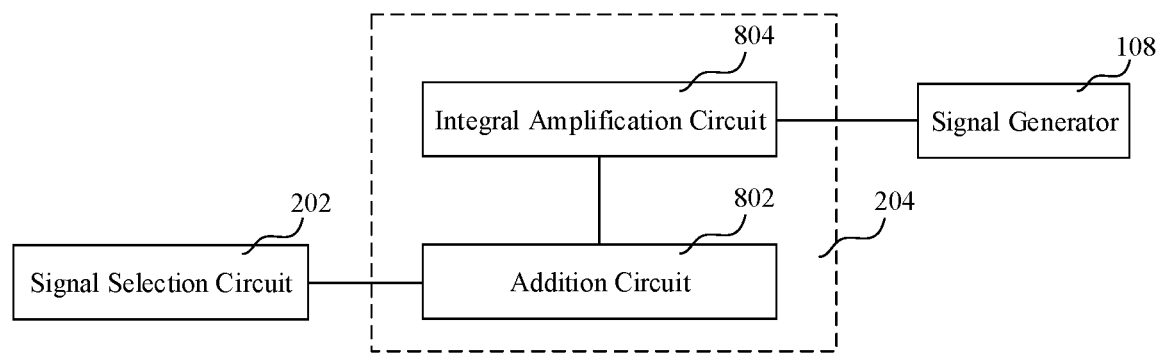
FIG. 8 is a block diagram showing a configuration of a signal amplification circuit in some embodiments.

In some embodiments, as shown in FIG. 8, the signal amplification circuit 204 includes an addition circuit 802 and an integral amplification circuit 804. The addition circuit 802 is connected to the signal selection circuit 202 and the integral amplification circuit 804 respectively, and the integral amplification circuit 804 is connected to the signal generator 108. The addition circuit 802 is configured to superimpose the current signal component output from the signal selection circuit 202, and the integral amplification circuit 804 is configured to amplify a superimposed signal and transmit the superimposed signal to the signal generator 108.

Specifically, the signal selection circuit 202 outputs the current signal component, and the addition circuit 802 will superimpose the current signal component to achieve algebraic operations on the signal. Then the signal output from the addition circuit 802 is amplified by the integration amplification circuit 804, and finally the signal generator 108 receives the signal and generates the corresponding current.

In some embodiments, the signal generator 108 is configured to output a feedback current to the feedback coil 109 and adjust an amplitude of the feedback current based on the current signal component until the induced signal output from the TMR chip 104 is 0, and output the measurement result of the selected current signal component. The feedback current is used for the feedback coil to generate a magnetic field opposite to the measured current.

Specifically, the signal generator 108 converts a signal received from the signal processing circuit 106 into a current, and outputs the feedback current to the feedback coil 109. The feedback coil 109 generates the magnetic field due to the presence of current. This magnetic field interacts with a magnetic field generated by the magnetism gathering iron core 102 according to the measured current in the conductor 100, which in turn affects the induced signal output from the TMR chip 104. The signal generator 108 can adjust the amplitude of the feedback current based on the received current signal component. By changing the feedback current to adjust the magnetic field until the TMR chip 104 is located at the zero point of the magnetic field and does not output the induced signal, the measurement result of the selected current signal component will be calculated based on the feedback current output to the feedback coil 109.

Further, assuming that the measured current is I, the feedback coil 109 is wound around the magnetism gathering iron core 102 with N turns, and the feedback current from the signal generator 108 output to the feedback coil 109 is $I_S$. To make an output of the TMR chip 104 be zero, the measured current is denoted as:

$$I = N*I_S.$$

When the above equation is established, the magnetic field generated by the feedback coil and the magnetic field generated by the measured current in the magnetism gathering iron core cancel each other, and the induced signal output from the TMR chip 104 is 0. Then the feedback current $I_S$ is multiplied by the number of turns N of the magnetism gathering iron core 102 to obtain the measurement result and output it.

In these embodiments, by outputting the feedback current to the feedback coil 109, the magnetic field generated by the feedback coil 109 interacts with the magnetic field generated by the magnetism gathering iron core 102 according to the conductor 100, which in turn affects the induced signal output from the TMR chip 104, thus forming a closed-loop feedback to achieve an accurate measurement for a current.

In some embodiments, the signal generator 108 is further configured to adjust direction of the feedback current based on the current signal component.

Specifically, the signal generator 108 can not only change the amplitude of the feedback current, but also change the direction of the output feedback current based on the received current signal component. If the direction of the measured current in the conductor 100 is different, the direction of the induced magnetic field converging in the magnetism gathering iron core 102 is also different, and the inducted signal generated by the TMR chip based on the induced magnetic field of the magnetism gathering iron core 102 also has a positive and negative direction, and the positive and negative directions of the induced signal are determined by the direction of the magnetic field. Because the induced signal has the positive and negative direction, the current signal component received by the signal generator 108 also has a positive and negative direction. The signal generator 108 determines the direction of the feedback current in the feedback coil 109 based on the received current signal component, thereby generating the magnetic field in the feedback coil 109 that is opposite to the measured current.

The technical features in the above embodiments can be combined arbitrarily. For concise description, not all possible combinations of the technical features in the above embodiments are described. However, all the combinations of the technical features are to be considered as falling within the scope described in this specification provided that they do not conflict with each other.

The above-mentioned embodiments only describe several implementations of the present disclosure, and their description is specific and detailed, but should not be understood as a limitation on the patent scope of the present disclosure. It should be pointed out that for those skilled in the art may further make variations and improvements without departing from the conception of the present disclosure, and these all fall within the protection scope of the present disclosure. Therefore, the protection scope of the present disclosure should be subject to the appended claims.

What is claimed is:

1. An AC/DC closed-loop current sensor, comprising: a magnetism gathering iron core, a TMR chip, a sampling circuit, a bandpass filtering circuit, a DC filtering circuit, a selection circuit, a signal amplification circuit, a signal generator, and a feedback coil, wherein the TMR chip is arranged at an air gap of the magnetism gathering iron core, the sampling circuit is connected to the TMR chip, the bandpass filtering circuit, and the DC filtering circuit respectively, the selection circuit is connected to the bandpass filtering circuit, the DC filtering circuit, and the signal amplification circuit respectively, the signal amplification circuit is connected to the signal generator, the feedback coil is wound around the magnetism gathering iron core and connected to the signal generator;

wherein the magnetism gathering iron core is configured to converge an induced magnetic field based on a measured current, the TMR chip is configured to output an induced signal based on the induced magnetic field, the sampling circuit is configured to sample and process the induced signal, the bandpass filtering circuit and the DC filtering circuit are configured to select a current signal component from the induced signal, the selection circuit is configured to select the current signal component, the signal amplification circuit is configured to amplify the current signal component to obtain the current signal component and send the current signal component to the signal generator, and the signal generator is configured to adjust a current output to the feedback coil based on the current signal component, and output a measurement result of the selected current signal component;

wherein the bandpass filtering circuit is a dual-phase lock-in amplification circuit, the dual-phase lock-in amplification circuit adopts a lock-in amplifier with dual-phase phase-sensitive detection technology, a parallel lock-in amplifier is set on the lock-in amplifier, and a 90° phase shift is added to the parallel lock-in amplifier; the dual-phase lock-in amplification circuit uses a cross-correlation characteristic of a reference signal and a sample signal to extract a sample signal component with the same frequency and phase as the reference signal.

2. The AC/DC closed-loop current sensor of claim 1, wherein the sampling circuit is configured to obtain the induced signal of the TMR chip and output a sample signal, the bandpass filtering circuit is configured to select an AC signal component of the sample signal based on a set reference signal frequency, the DC filtering circuit is configured to filter a DC signal component of the sample signal, and the selection circuit is configured to connect the bandpass filtering circuit and/or the DC filtering circuit.

3. The AC/DC closed-loop current sensor of claim 1, wherein the set reference signal frequency for the dual-phase lock-in amplification circuit is 50 Hz.

4. The AC/DC closed-loop current sensor of claim 2, wherein the DC filtering circuit is a second-order RC low-pass DC filtering circuit.

5. The AC/DC closed-loop current sensor of claim 2, wherein the DC filtering circuit is an active second-order low-pass filtering circuit.

6. The AC/DC closed-loop current sensor of claim 1, wherein the signal amplification circuit comprises an addition circuit and an integral amplification circuit, and wherein the addition circuit is connected to the signal selection circuit and the integral amplification circuit respectively, the integral amplification circuit is connected to the signal generator, the addition circuit is configured to superimpose the current signal component output from the signal selection circuit, and the integral amplification circuit is configured to amplify a superimposed signal and transmit the superimposed signal to the signal generator.

7. The AC/DC closed-loop current sensor of claim 1, wherein the signal generator is configured to output a feedback current to the feedback coil and adjust an amplitude of the feedback current based on the current signal component until the induced signal output from the TMR chip is 0, and output the measurement result of the selected current signal component; and the feedback current is used for the feedback coil to generate a magnetic field opposite to the measured current.

8. The AC/DC closed-loop current sensor of claim 7, wherein the signal generator is further configured to adjust direction of the feedback current based on the current signal component.

9. The AC/DC closed-loop current sensor of claim 1, wherein the magnetism gathering iron core is an open circular structure with an air gap.

10. The AC/DC closed-loop current sensor of claim 1, wherein the TMR chip is a single-axis TMR chip.

* * * * *